(12) United States Patent
King et al.

(10) Patent No.: US 6,753,229 B1
(45) Date of Patent: Jun. 22, 2004

(54) MULTIPLE-THICKNESS GATE OXIDE FORMED BY OXYGEN IMPLANTATION

(75) Inventors: Ya-Chin King, Berkeley, CA (US); Tsu-Jae King, Fremont, CA (US); Chen Ming Hu, Alamo, CA (US)

(73) Assignee: The Regents of the University of California, Oakland, CA (US)

( * ) Notice: Subject to any disclaimer, the term of this patent is extended or adjusted under 35 U.S.C. 154(b) by 233 days.

(21) Appl. No.: 09/449,063

(22) Filed: Nov. 24, 1999

Related U.S. Application Data

(60) Provisional application No. 60/110,885, filed on Dec. 4, 1998.

(51) Int. Cl.[7] .................. H01L 21/00; H01L 21/336
(52) U.S. Cl. .................. 438/287; 438/785; 438/763
(58) Field of Search ................. 438/981, 762, 438/286, 770, 287, 785, 763

(56) References Cited

U.S. PATENT DOCUMENTS

| | | | |
|---|---|---|---|
| 4,105,805 A | 8/1978 | Glendinning et al. | 427/38 |
| 4,704,302 A | 11/1987 | Bruel et al. | 427/38 |
| 4,874,718 A | 10/1989 | Inoue | 437/62 |
| 4,967,245 A | 10/1990 | Cogan et al. | |
| 4,968,636 A | 11/1990 | Sugawara | 437/24 |
| 5,077,225 A | 12/1991 | Lee | 437/24 |
| 5,182,226 A | 1/1993 | Jang | 437/70 |
| 5,183,775 A | 2/1993 | Levy | 437/60 |
| 5,364,800 A | 11/1994 | Joyner | 437/28 |
| 5,429,955 A | 7/1995 | Joyner et al. | 437/26 |
| 5,441,899 A | 8/1995 | Nakai et al. | 437/24 |
| 5,480,828 A * | 1/1996 | Hsu et al. | |
| 5,616,509 A | 4/1997 | Hayashi | 438/234 |
| 5,658,809 A | 8/1997 | Nakashima et al. | 438/766 |
| 5,672,521 A * | 9/1997 | Barsan et al. | |
| 5,705,412 A | 1/1998 | Aklufi | 437/40 |
| 5,712,186 A | 1/1998 | Thakur et al. | 437/69 |
| 5,780,347 A | 7/1998 | Kapoor | 438/301 |
| 5,930,620 A * | 7/1999 | Wristers et al. | 438/243 |
| 6,027,977 A * | 2/2000 | Mogami | 438/287 |
| 6,054,374 A * | 4/2000 | Gardner et al. | 438/528 |

* cited by examiner

Primary Examiner—Richard Booth
(74) Attorney, Agent, or Firm—Beyer, Weaver & Thomas, LLP

(57) ABSTRACT

A process for forming gate oxides of multiple thicknesses. Oxygen is implanted through a sacrificial oxide into selected regions of a silicon substrate according to a patterned photoresist mask. After stripping the sacrificial oxide, a thermal growth process produces a thicker oxide in the implanted regions than in the non-implanted regions. The oxygen-implanted oxide has excellent quality and thickness differentials of up to 20 Å may be obtained with relatively low oxygen implant doses. In an alternative process, a thin gate oxide may be grown prior to a polysilicon layer deposition, and oxygen is then implanted through the polysilicon according to a patterned photoresist mask. After stripping the photoresist, an anneal increases the thickness of the gate oxide in the implanted regions. In another embodiment, a high dielectric constant dielectric layer is deposited on the substrate prior to polysilicon deposition to limit subsequent silicon oxide growth.

6 Claims, 6 Drawing Sheets

MULTIPLE-THICKNESS GATE OXIDE FORMED BY OXYGEN IMPLANTATION

This application claims the benefit of provisional application No. 60/110,885, filed Dec. 4, 1998.

BACKGROUND OF THE INVENTION

The present invention relates to the manufacture of electronic devices, particularly semiconductor devices, such as logic circuits, memory circuits, and/or combinations thereof.

Electronic devices are being made that combine various types of circuits on a single chip of semiconductor material. For example, devices are being made that combine logic circuits with memory arrays, or various types of memory, so that higher functionality can be achieved on a single chip. This type of integration often provides lower cost, smaller size and improved reliability compared to achieving the same functionality with a number of different chips wired together. Unfortunately, it can be difficult to integrate the manufacture of one type of circuit with another on a single chip.

Different types of circuits might have different types of devices that require different voltage inputs, and that have different thickness of gate oxide. For example, a logic field-effect transistor ("FET") might have a different gate oxide thickness than an electronically erasable-programmable read only memory cell, or than a dynamic read-addressable memory ("DRAM") cell. It is generally desirable to make all the gate oxides for all the devices on the chip in a single process step; therefore, it may be necessary to make the gate oxide in some regions thinner than the gate oxide in other regions.

A technique has been used to vary the thickness of an oxide layer grown on a silicon wafer during a oxide growth process by implanting nitrogen into selected regions of the silicon. The implanted nitrogen retards the growth of silicon oxide, resulting in a gate oxide of diminished thickness where the nitrogen was implanted. However, implanting nitrogen can degrade the resultant quality of the gate oxide. Gate oxide quality is especially important, compared to an inter-metal dielectric layer, for example, because of the electric field gradients a gate oxide must withstand and the low current leakage that is generally desired for good device performance. The quality of the gate oxide becomes even more important as device geometry and operating voltages shrink, both of which are associated with thinner gate oxides.

Therefore, it is desirable to fabricate an electronic device die with multiple thicknesses of gate oxide, and it is further desirable to be able to fabricate gate oxides of superior quality, especially thin gate oxides.

SUMMARY OF THE INVENTION

According to the present invention a multiple-thickness oxide layer may be grown by implanting oxygen into selected regions of a substrate where a thicker oxide layer is desired. In one embodiment, oxygen is implanted into selected regions of a silicon substrate through a thin sacrificial layer at an energy between about 10–30 keV. The sacrificial layer reduces implantation damage to the underlying silicon, and is stripped prior to thermal oxidation of the substrate, and the resulting oxide layer has multiple thickness and is of high quality and is suitable for a gate dielectric, for example.

In another embodiment, a polysilicon layer between about 1,000–1,5000 Å thick is deposited over a gate oxide prior to implanting oxygen into selected regions of the silicon substrate. The implant energy is chosen according to the thickness of the polysilicon layer to place the peak of the oxygen profile just above the gate oxide. The substrate is then annealed in a nitrogen ambient at a temperature of about 900° C. for about 30 minutes to grow a thicker oxide in the regions that were implanted with oxygen.

Implanting oxygen to increase oxide thickness can provide a differential thickness of about 5–20 Å for implant doses of between about $5E15/cm^2$–$1E16/cm^2$. Unlike nitrogen implantation techniques, where the thickness differential is highly sensitive to the thickness of the oxide, the present invention provides a differential thickness that is less sensitive to the oxide thickness. Additionally, the oxygen-implanted oxides exhibit superior reliability to nitrogen-implanted oxides, and even non-implanted oxides.

DESCRIPTION OF THE SPECIFIC EMBODIMENTS

As noted above, the present invention provides an improved multiple-thickness gate oxide for transistors on a single semiconductor die.

Figure 1A:
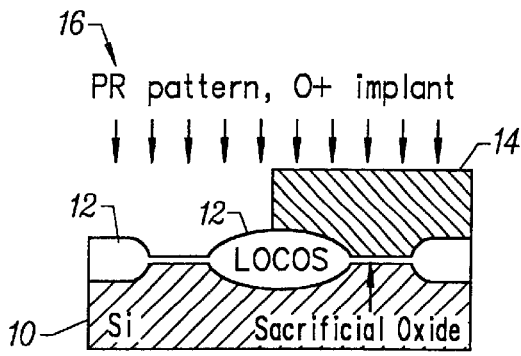
FIGS. 1A–1C are simplified cross sections of a semiconductor die illustrating a fabrication sequence resulting in multiple oxide thicknesses using an oxygen implant performed prior to gate oxidation, according to an embodiment of the present invention.

FIGS. 1A–1C and FIGS. 1D–1E illustrate steps for two embodiments of the invention in forming multiple gate oxide thicknesses. In FIG. 1A a silicon substrate 10 has a layer of LOCOS silicon oxide 12 on a surface with a layer of photoresist formed over a portion of oxide 12 to limit implantation of oxygen at 16. Thereafter, in FIG. 1B the photoresist and thin LOCOS oxide are striped, and in FIG. 1C gate oxide, $T_{OX1}$ and $T_{OX2}$, are grown on the surface. $T_{OX2}$ over the heavier implanted oxygen is thicker than $T_{OX1}$ over the lighter implanted (or non-implanted) oxygen. Gate oxidation is carried out at 800° C. followed by a two hour anneal at 500° C. Source and drain anneal is carried out later at 900° C. for 30 minutes.

Figure 1B:
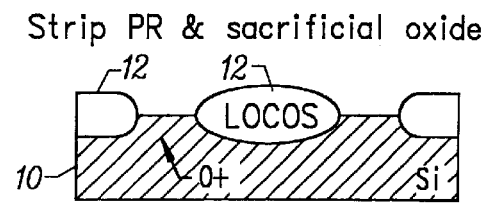
Figure 1C:
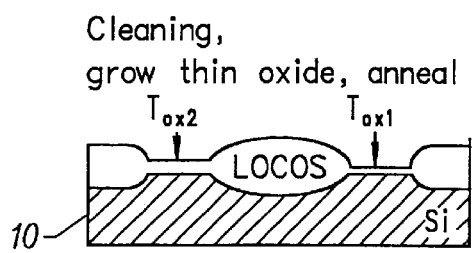
Figure 1D:
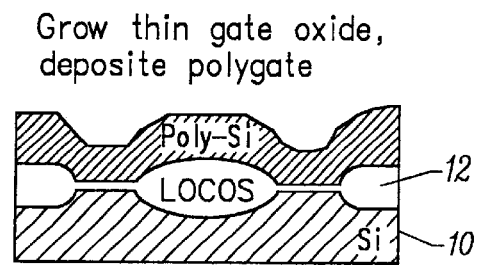
FIGS. 1D–1F are simplified cross sections of a semiconductor die illustrating a fabrication sequence resulting in multiple oxide thicknesses using an oxygen implant performed after a polysilicon deposition, according to another embodiment of the present invention.
Figure 1E:
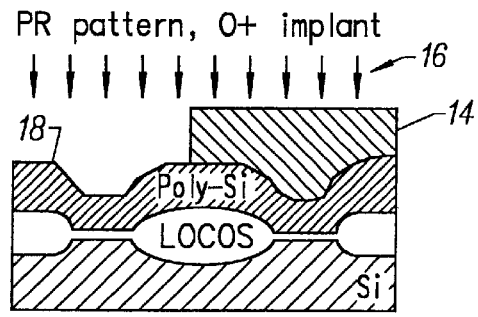
Figure 1F:
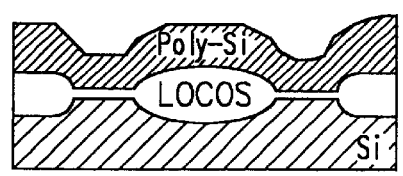

The steps in the second embodiment illustrated in FIGS. 1D–1F are similar to the steps in the first embodiment, but the oxygen implant 16 is after the polysilicon gate 18 deposition to prevent damage and contamination of the substrate. Again, photoresist 14 is utilized to vary or prevent the oxygen implant.

Previous studies of forming thicker gate oxides using large implant dose of oxygen ($\sim 10^{17}$–$2 \times 10^{18}$ cm$^{-2}$) have shown that severe damage occurs in the substrate, casting oxygen implant as an unsuitable technique for forming gate oxides. Due to the scaling of the gate oxide, however, the thickness differentials in today's embedded circuits is less than 5 nm as illustrated in the following table:

| Circuit | Gate Voltage | Gate Oxide Thickness |
| --- | --- | --- |
| Logic | 1.5 V | 30 Å |
| I/O | 2.5 V | 50 Å |
| DRAM | 2.0 V | 40 Å |
| EEPROM | −8 V | 80 Å |

Figure 2:
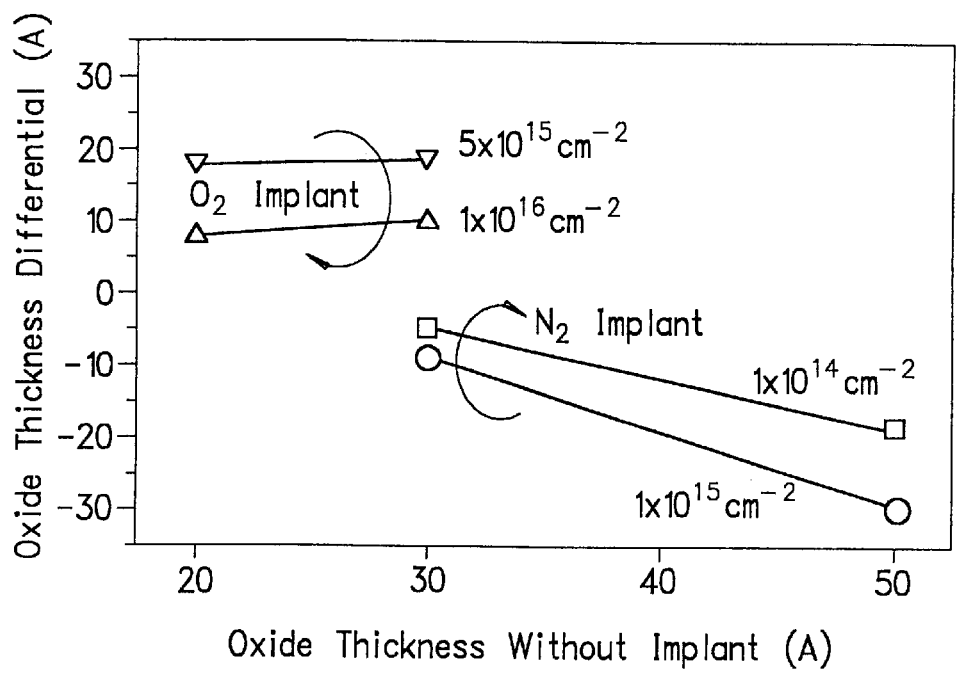
FIG. 2 is a graph illustrating the oxide thickness differential between implanted and unimplanted regions for oxygen implants and nitrogen implants versus unimplanted oxide thickness.

FIG. 2 is a graph illustrating oxide thickness without implant and the resulting oxide thicknesses with oxygen implant and with nitrogen implant. FIG. 2 shows that the oxide thickness differential created with a nitrogen implant strongly depends on the unimplanted oxide thickness. In contrast, the thickness differential is independent of the unimplanted $T_{OX}$ when the oxygen implant is used.

Figure 3:
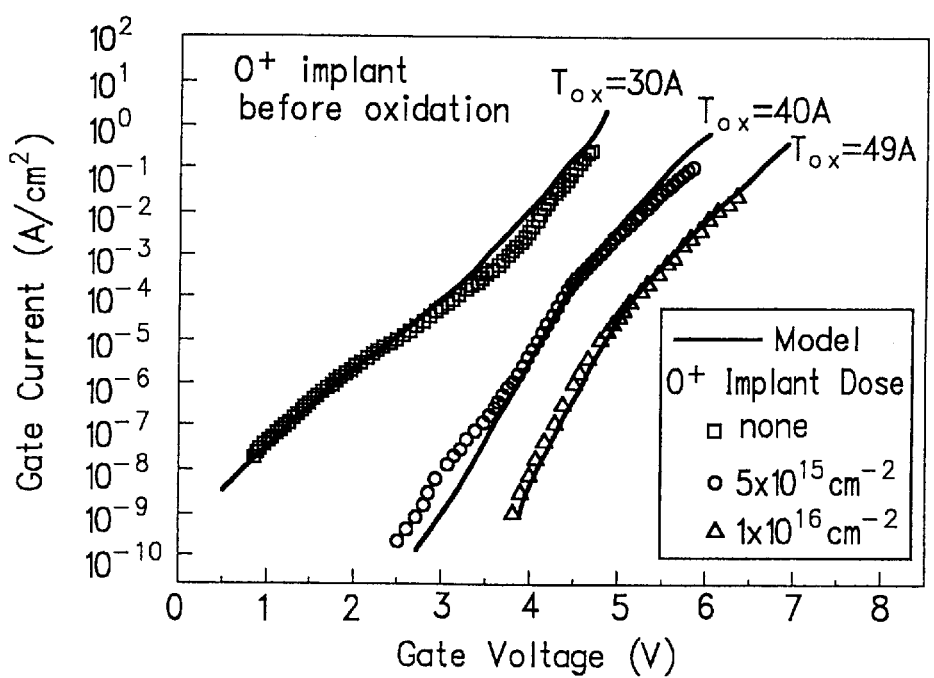
FIG. 3 is a graph illustrating the tunneling current characteristics of gate oxides formed in accordance with the fabrication sequence illustrated in FIGS. 1A–1C and an unimplanted gate oxide.
Figure 4:
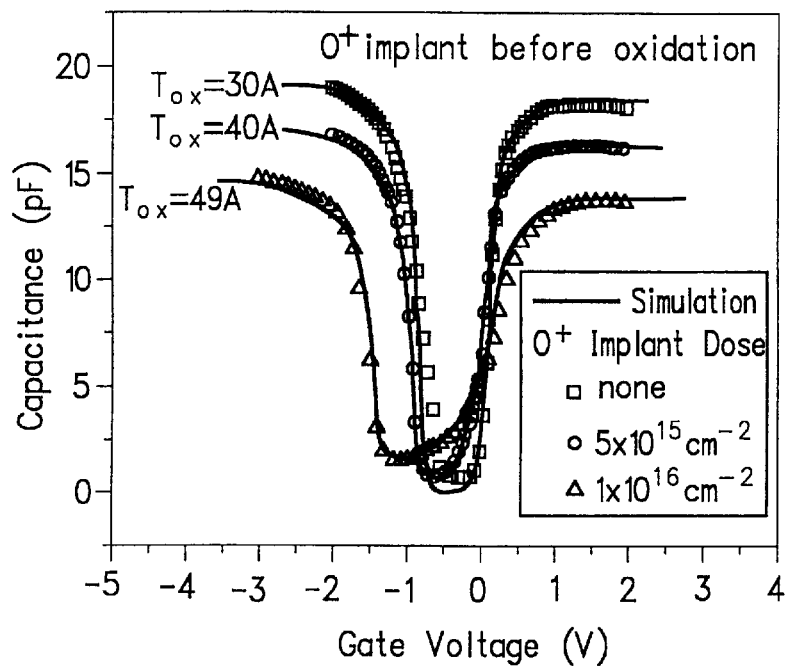
FIG. 4 is a graph showing the capacitance versus gate voltage for the samples shown in FIG. 3.
Figure 5:
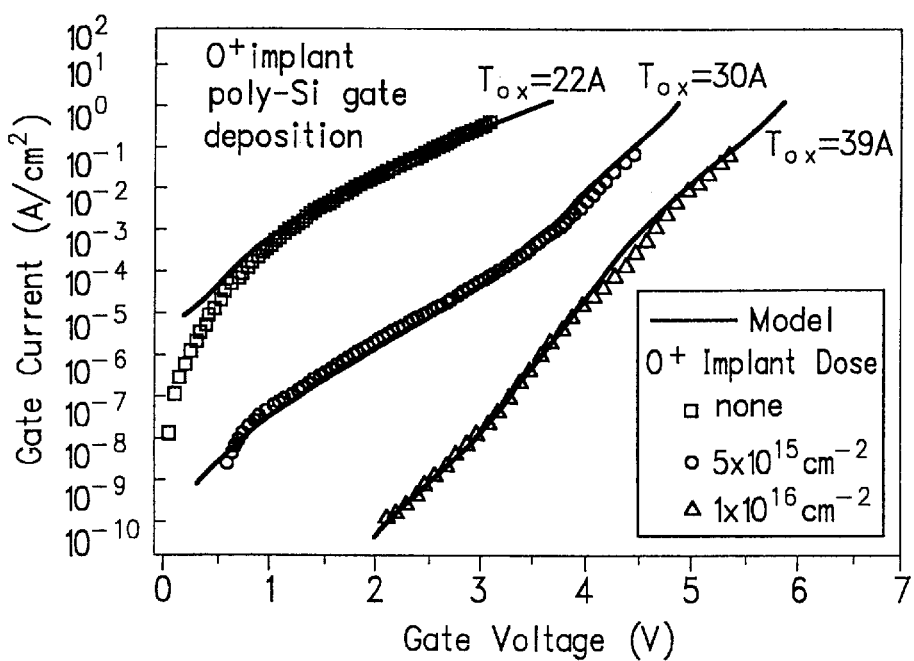
FIG. 5 is a graph illustrating the tunneling current characteristics of gate oxides formed in accordance with the fabrication sequence illustrated in FIGS. 1D–1F and an unimplanted gate oxide.
Figure 6:
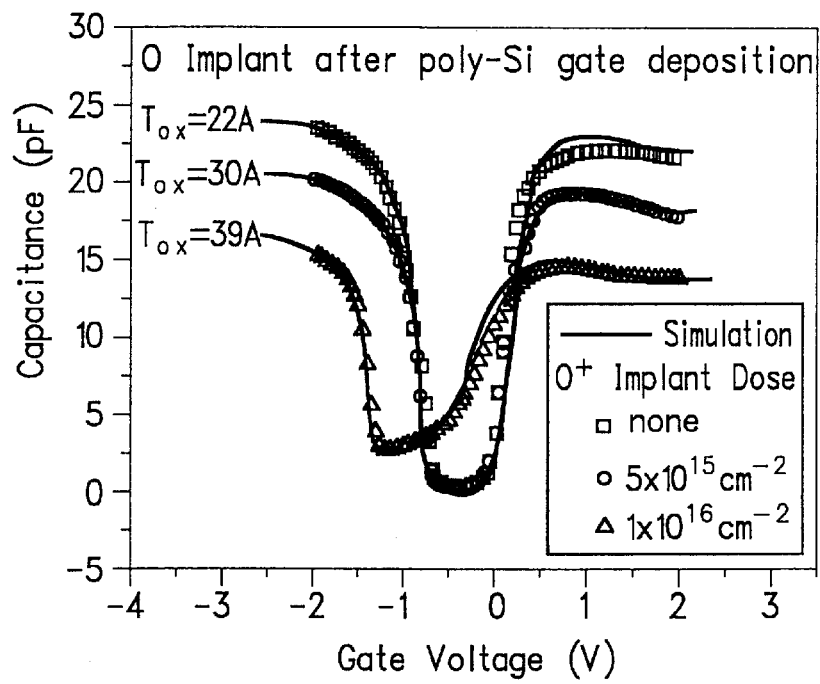
FIG. 6 is a graph showing the capacitance versus gate voltage for the samples shown in FIG. 5.

FIG. 3 plots gate voltage (V) versus gate current (A/cm$^2$) and illustrates the tunneling current characteristics for the gate oxide formed with oxygen implant using the process of FIGS. 1A–1C. The physical thicknesses were extracted by comparing the measured current with the theoretical tunneling current and were confirmed by pairing the measured high frequency CV data with simulated results from a 1-D self-consistent Shrodinger and Poison equations solver, as illustrated in FIG. 4. It was found that as the oxygen implant dose increases, the substrate doping level and thus $\|V_t\|$ also rises as a result of thermal donor generation from excess oxygen in the substrate. This effect can be eliminated by optimizing the anneal steps. FIGS. 5 and 6 are similar to FIGS. 3 and 4 and show that similar increases in oxide thickness are also achieved with oxygen implanted after polysilicon deposition. The good agreement of the measured IV and CV data with theory in FIGS. 3–6 demonstrates that neither the interface nor the bulk property of the oxide is compromised by the oxygen implant.

Figure 7:
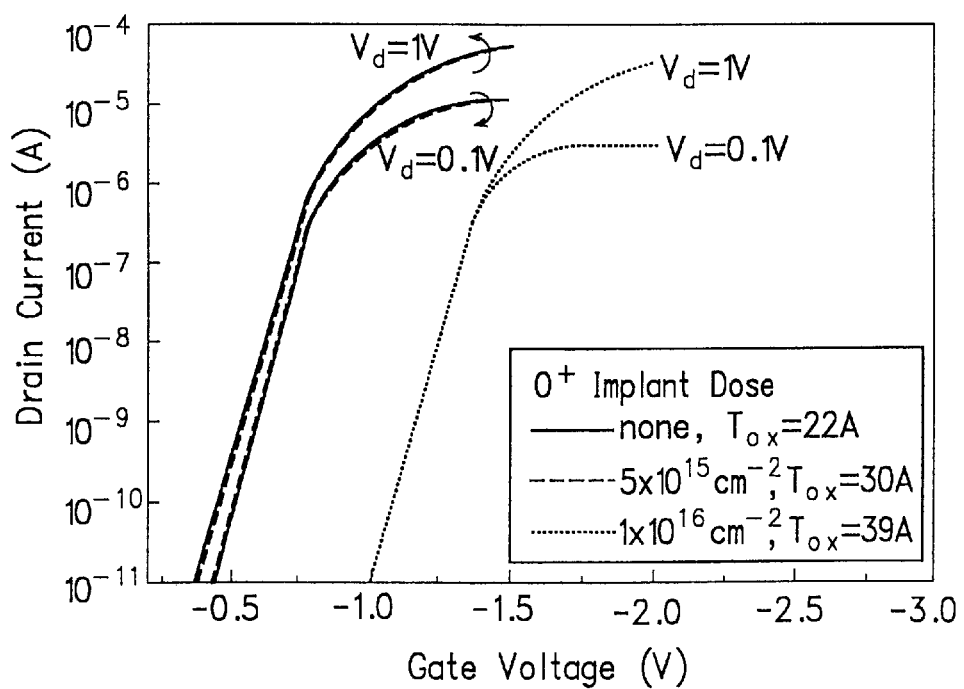
FIG. 7 is a graph of drain current versus gate voltage for various oxide layers at various drain bias voltages.

FIG. 7 is a plot of gate voltage (V) versus drain current (A) and illustrates the subthreshold characteristics of transistors with gate oxide formed from various oxygen implant doses. No degradation in subthreshold swing or excessive leakage was observed in devices fabricated with the oxygen implant technology of the present invention.

Figure 8:
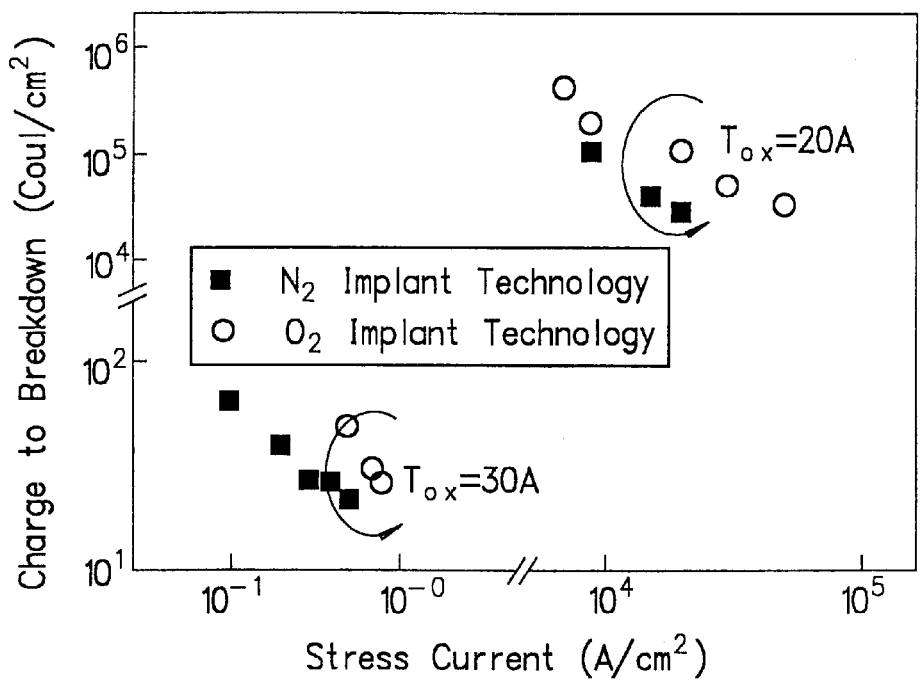
FIG. 8 is a graph of charge-to-breakdown versus stress current for relatively thin oxide layers fabricated with nitrogen implant technology and for oxide layers fabricated with oxygen implant technology of comparable thicknesses.
Figure 9:
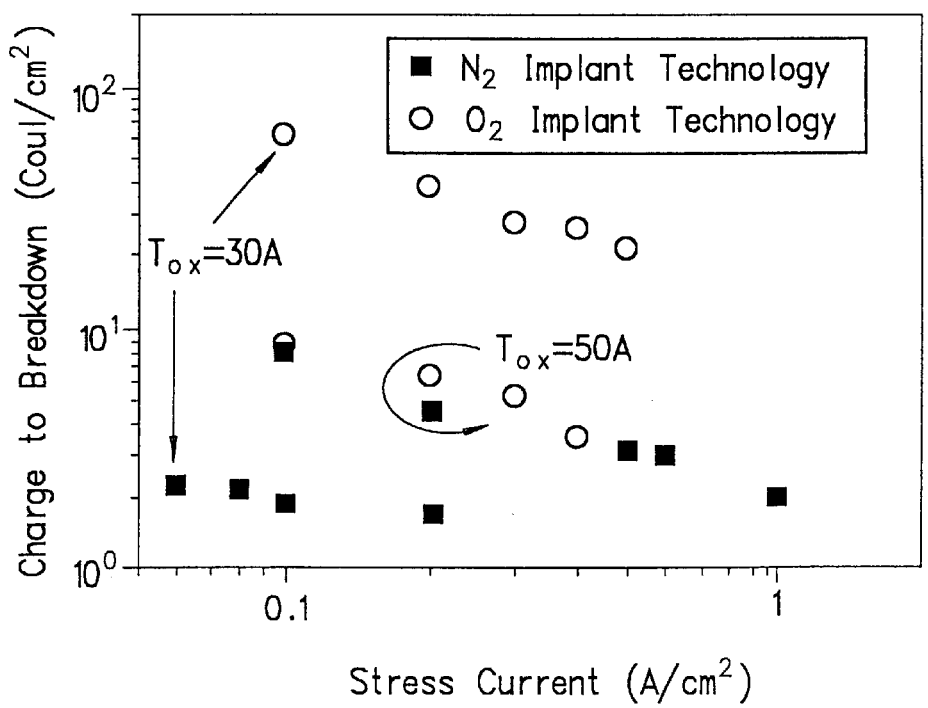
FIG. 9 is a graph of charge-to-breakdown versus stress current for relatively thick oxide layers fabricated with nitrogen implant technology and for oxide layers fabricated with oxygen implant technology of comparable thicknesses.
Figure 10:
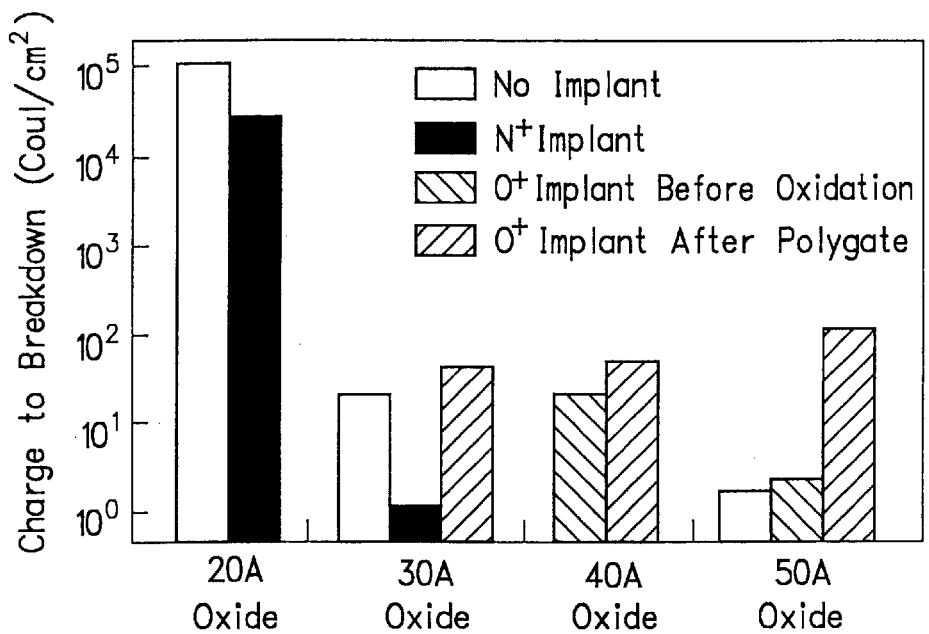
FIG. 10 is a bar chart of charge-to-breakdown at a constant stress current density for oxides of various thicknesses made using a nitrogen implantation method, oxygen implantation methods, and no implantation.
Figure 11:
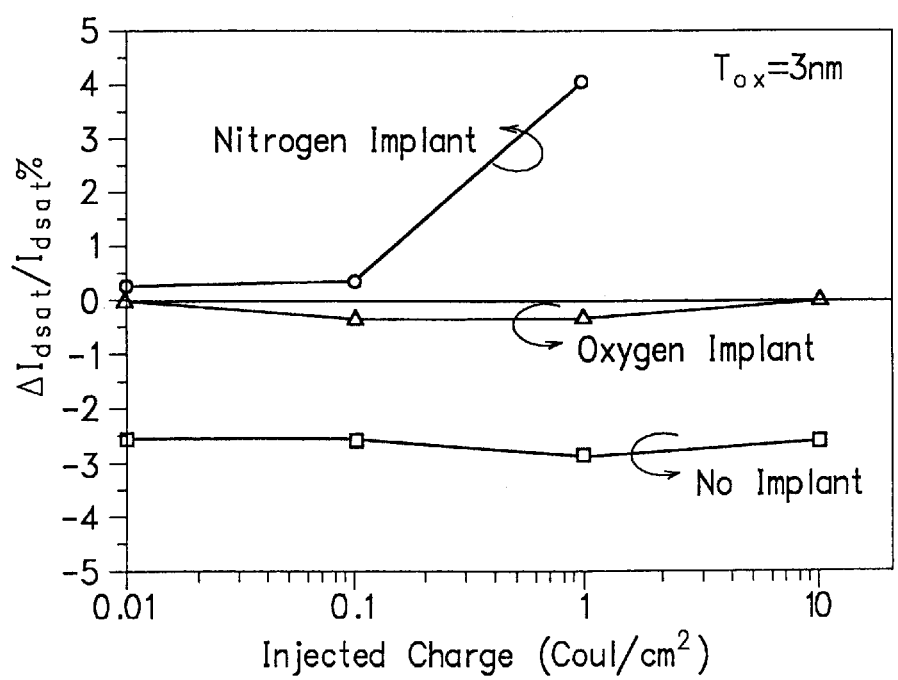
FIG. 11 is a graph of drain current degradation versus injected charge for oxide layers of comparable thickness using a nitrogen implantation technique, an oxygen implantation technique, and no implant.

FIGS. 8 and 9 are plots of stress current (A/cm$^2$) versus change to breakdown (Coul/cm$^2$) and illustrate the reliability of the oxides grown by oxygen implant as compared with those formed by nitrogen implant. FIGS. 8 and 9 show that 20 Å/30 Å and 30 Å/50 Å multiple oxide technologies using oxygen implant yield significantly larger $Q_{BD}$ that the nitrogen implant technology. FIG. 10 shows that oxygen implanted oxides have even better $Q_{BD}$ than the conventional oxide while nitrogen implanted oxides have significantly lower $Q_{BD}$. The $Q_{BD}$ of each thickness group was measured at the same stress currently density. In FIG. 11, oxides with the oxygen implant showed smaller drain current degradation after Fowler-Nordheim current stressing.

In another embodiment of the invention, the process illustrated in FIGS. 1D–1E includes the deposition of a high dielectric constant layer at the silicon substrate surface prior to the deposition of the polysilicon gate 18. A suitable high dielectric constant layer can be a silicon nitride, zirconium oxide, or hafnium silicate (HfSiO). Thereafter, oxygen implantation into the silicon substrate and/or polysilicon gate followed by annealing, as in the process of FIGS. 1D–1F, will grow a very thin (<2 nm) silicon oxide with well-controlled thickness. The thin silicon oxide can serve as the buffer layer or interfacial layer that is critical to the attainment of high carrier mobility and low interface defects. In the prior art, the buffer layer is deposited or grown in an oxygen gas atmosphere with buffer layer thickness difficult to control.

While the above is a full description of the specific embodiments, various modifications, alternative constructions, and equivalents may be used. For example, while reference is made to "O$_2$" implants, it is understood that the implant is done with an O$^+$ oxygen ion, or other types of oxygen, such as oxygen plasma species, or radicals, or even oxygen containing compounds, such as OH$^-$, might be used to implement the present invention. Similarly, although the invention has been described in terms of a silicon substrate, it is understood that such a silicon substrate might be a single-crystal silicon wafer, a silicon-on-insulator wafer, a silicon-containing substrate, or the like. Therefore, the above description and illustrations should not be taken as limiting the scope of the present invention, which is defined by the appended claims.

What is claimed is:

1. A method of forming a multiple-thickness gate dielectric layer on a silicon substrate, the method comprising:
   a) forming a gate dielectric layer on a silicon substrate;
   b) forming a high dielectric constant polysilicon layer on the gate dielectric layer;
   c) patterning an implant mask layer on the polysilicon layer;
   d) selectively implanting oxygen through the polysilicon layer and the dielectric layer and into the silicon substrate;
   e) stripping the implant mask layer from the substrate; and
   f) annealing the substrate to form an interfacial oxide layer under the dielectric layer.

2. A method of forming a gate dielectric layer on a silicon substrate, the method comprising:
   a) forming a high dielectric constant dielectric layer on a silicon substrate;
   b) forming a polysilicon layer on the dielectric layer;
   c) patterning an implant mask layer on the polysilicon layer;
   d) implanting oxygen through the polysilicon layer and into the substrate;

e) stripping the implant mask layer from the substrate; and f) annealing the substrate to form an interfacial oxide layer in the substrate under the dielectric layer.

3. The method of claim 2 wherein the dielectric layer is selected from the group consisting of silicon nitride, zirconium oxide, and hafnium silicate.

4. The method of claim 2 wherein the interfacial oxide layer is less than 2 nm in thickness.

5. The method as defined in claim 1 wherein the dielectric layer is selected from the group consisting of silicon nitride, zirconium oxide, and hafnium silicate.

6. The method as defined in claim 1, wherein the interfacial oxide layer is less than 2 nm in thickness.

M

\* \* \* \* \*